(12) United States Patent
Bayerer et al.

(10) Patent No.: US 8,487,407 B2
(45) Date of Patent: Jul. 16, 2013

(54) LOW IMPEDANCE GATE CONTROL METHOD AND APPARATUS

(75) Inventors: Reinhold Bayerer, Warstein (DE); Daniel Domes, Rüthen (DE)

(73) Assignee: Infineon Technologies AG, Neubiberg (DE)

( * ) Notice: Subject to any disclaimer, the term of this patent is extended or adjusted under 35 U.S.C. 154(b) by 95 days.

(21) Appl. No.: 13/272,741

(22) Filed: Oct. 13, 2011

(65) Prior Publication Data
US 2013/0093046 A1   Apr. 18, 2013

(51) Int. Cl.
*H01L 21/02* (2006.01)
*H01L 23/48* (2006.01)
*H01L 23/52* (2006.01)
*H03K 17/72* (2006.01)

(52) U.S. Cl.
USPC ............ 257/532; 257/690; 257/691; 327/442

(58) Field of Classification Search
USPC ......................................... 257/532
See application file for complete search history.

(56) References Cited

U.S. PATENT DOCUMENTS

| 4,766,481 | A | 8/1988 | Gobrecht et al. |
| 5,949,273 | A | 9/1999 | Mourick et al. |
| 2009/0085219 | A1 | 4/2009 | Bayerer |

FOREIGN PATENT DOCUMENTS

| DE | 100 31 462 A1 | 1/2002 |
| EP | 0 427 143 A2 | 5/1991 |
| EP | 0 818 889 B1 | 1/1998 |

OTHER PUBLICATIONS

Lutz, J. et al. "Short Circuit III in High Power IGBTs", 13th European Conference on Power Electronics and Applications, 2009. EPE '09. Sep. 8-10, 2009, pp. 1-8, Barcelona, Spain.
Bayerer, R. et al. "Power Circuit design for clean switching", CIPS 2010—6th International Conference on Integrated Power Electronics Systems, Mar. 16-18, 2010, Nuremberg, Germany.
Hierholzer, M. et al. "Improved Characteristics of 3.3kV IGBT Modules" Power Conversion Conference—Jun. 1997 Proceedings, pp. 201-205.

*Primary Examiner* — Long Tran
*Assistant Examiner* — Dzung Tran
(74) *Attorney, Agent, or Firm* — Murphy, Bilak & Homiller, PLLC

(57) ABSTRACT

According to one embodiment of a module, the module includes a plurality of gate driver chips coupled in parallel and having a common gate input, a common supply voltage and a common output. The chips are spaced apart from one another and have a combined width extending between an edge of a first outer one of the chips and an opposing edge of a second outer one of the chips. The module further includes a plurality of capacitors coupled in parallel between ground and the common supply voltage, and a transverse electromagnetic (TEM) transmission line medium coupled to the common output of the chips and having a current flow direction perpendicular to the combined width of the chips.

21 Claims, 14 Drawing Sheets

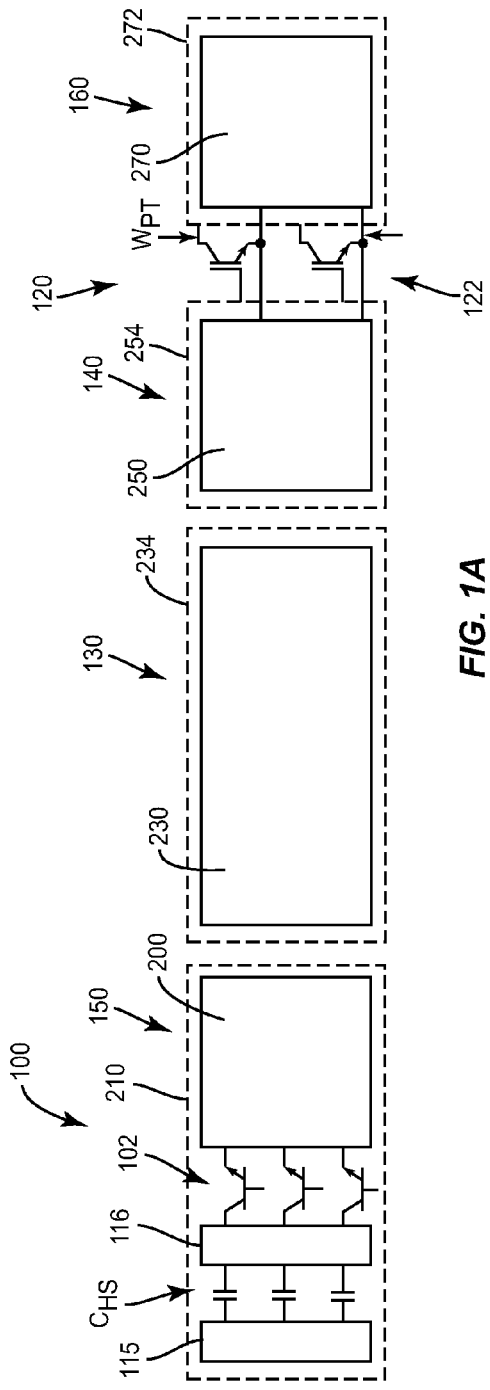
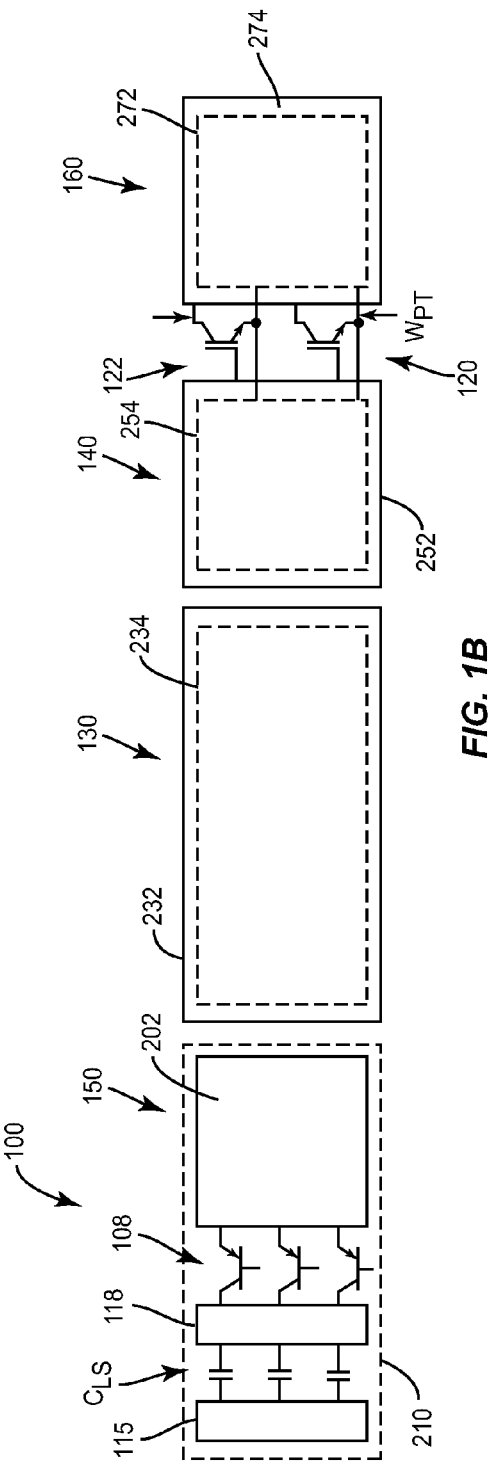

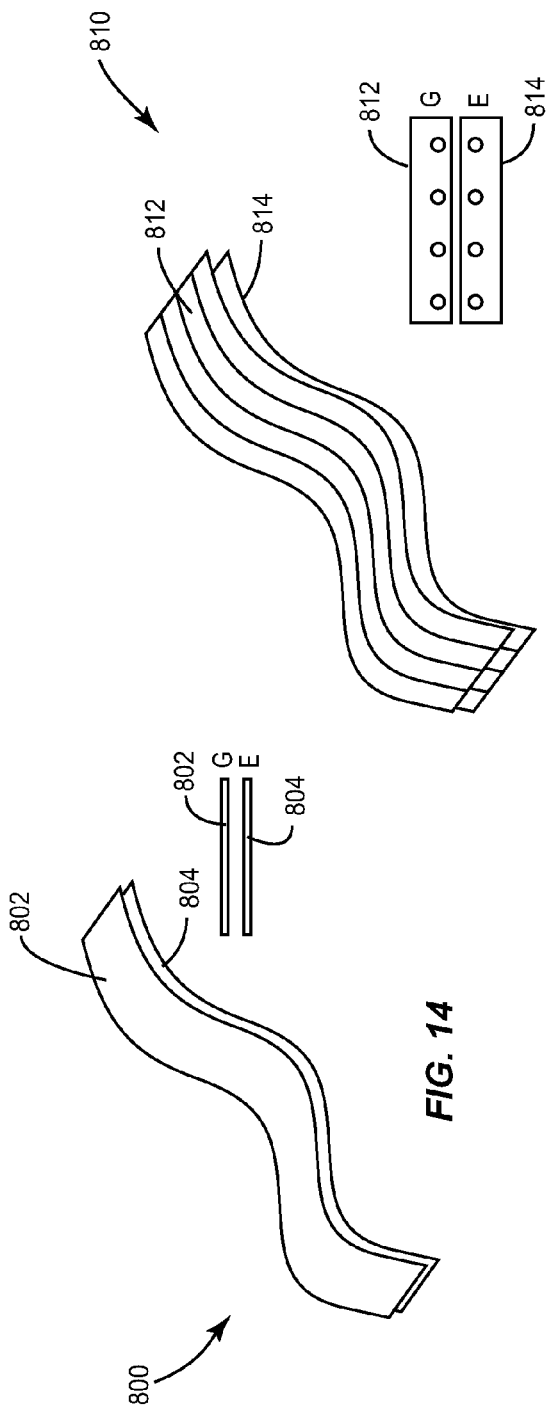
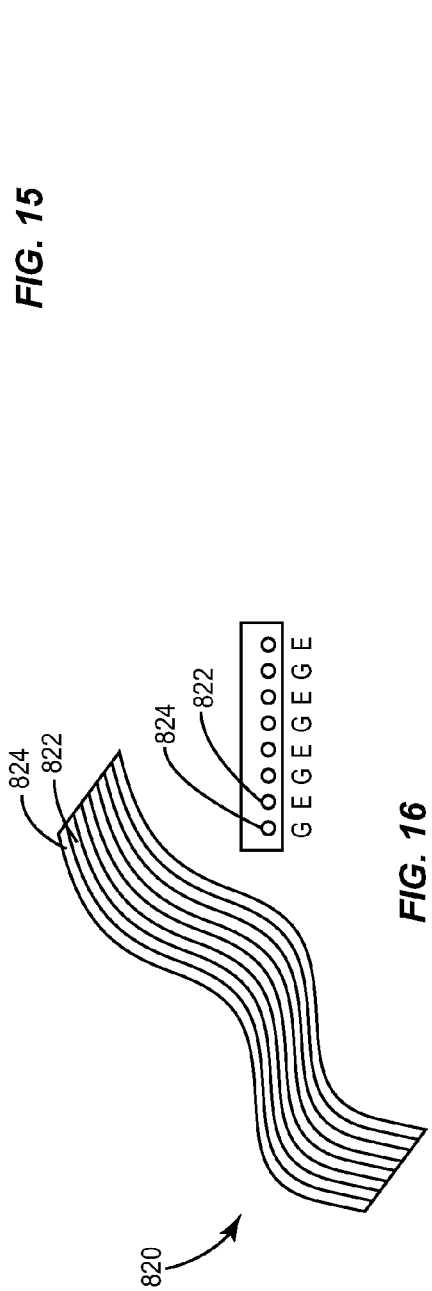
FIG. 14
FIG. 15
FIG. 16

LOW IMPEDANCE GATE CONTROL METHOD AND APPARATUS

TECHNICAL FIELD

The present application relates to power transistors, in particular power transistors having a low gate circuit inductance.

BACKGROUND

In power electronic circuits, e.g. inverters, converters, etc., power semiconductor switches such as MOSFETs (metal oxide semiconductor field effect transistors), IGBTs (insulated gate bipolar transistors), and JFETs (junction field effect transistors) are controlled through a control electrode such as a gate electrode for MOSFETs, gate electrode for IGBTs, (base current electrode for bipolar transistors), etc. Commands for controlling turn-on, turn-off, blocking and conducting states of the power semiconductor switches are generated in a controller and transferred to the control terminal by gate drivers for each power switch. The gate drivers shift the command signals from the controller input voltage (e.g. via a transformer, opto-coupler, level-shifter, etc.) and shape the drive signals for intended switching transitions (slope, rise and fall time, delay time, etc).

Power semiconductor devices as mentioned above can also be used to manage fault conditions e.g. by detecting short circuit of loads. A load short circuit can occur between two phases, all three phases or between one or more phases to ground. Under such short circuit conditions the output characteristics of the power semiconductors are utilized. For example, the drain (collector) current i.e. the current between the power terminals of the power semiconductor device saturates at about 4 to 10 times the rated current, whereas the saturation level is determined by the amount of gate voltage and the transfer characteristic of the device. Power semiconductors can withstand such high current conditions at high voltage for only few µs. The driver or controller senses such conditions quickly and turns off the power semiconductor device. Different types of short circuit conditions may arise. In each case, the characteristic di/dt response of the power circuit causes gate overvoltage conditions which arise because of the stray inductance seen at the gate input of the device. This stray inductance, generally referred to herein as the gate circuit inductance, includes the inductance associated with wiring on the board of the gate driver (board layout), the wiring from the gate driver to the control terminals of the power module, and terminals, wires and conductor paths inside the power module to the power transistor gates. The height of the gate overvoltage depends in part on the gate circuit inductance. In other words the speed at which charge at the gate can flow into the voltage source of the device is not only limited by the resistance of the gate circuit, but also by the inductance. The gate circuit inductance limits the speed by which gate current can change. Therefore, for typical gate circuits, gate over voltages can exceed 20V which is normally the maximum rating.

Also in modules for higher power chips which are paralleled together, the common gate requires a more powerful gate driver. Within the gate driver this is usually achieved by the use of transistors having higher current ratings and lower gate resistors. The wiring on the board of the gate driver (board layout), the wiring from the gate driver to the control terminals of the power module, and terminals, wires and conductor paths inside the power module to the gates of the paralleled devices remains similar as in the single transistor case. This yields a gate circuit inductance which is about the same as in the single transistor case. The current out of the common gate scales up with the number of devices in parallel. The di/dt of the gate current also scales up, accordingly. The gate circuit inductance is a function of the geometry in the driver circuit and the connections to the power transistor module. A lower gate circuit inductance improves short circuit response which aids in quickly limiting the gate voltage to the value set by the driver and consequently limiting short circuit current at a load followed by a fast turn-off of the short circuit (the main problem with high inductance in the gate circuit is the increase of gate voltage during a short circuit condition). A lower gate circuit inductance also improves the turn-on and turn-off response of power transistor devices, providing a faster device response time. Gate circuit inductance is conventionally overlooked in favor of resistive impedance. Gate circuit inductance has been addressed by the assembly of gate driver boards directly onto power module terminals without wiring in between. The inductance on the gate driver board and inside the power modules or packages is not typically addressed.

SUMMARY

Gate circuit inductance for power semiconductor devices is decreased by using one or more transverse electromagnetic (TEM) transmission line media to connect the output of a gate driver circuit to the gate input of a power semiconductor circuit. The circuits can be integrated in the same module, or contained in different modules. In either case, the gate driver circuit includes a plurality of gate driver chips coupled in parallel and the power semiconductor circuit similarly includes a plurality of power transistor chips coupled in parallel. The power transistor chips are spaced apart from one another and have a width extending between opposing edges of the outermost power transistor chips. The gate driver chips can have a similar width-wise spacing arrangement. Each TEM transmission line medium used to couple the common gate input of the power transistor chips to the common output of the gate driver chips has a current flow direction perpendicular to the combined width of the power transistor chips (and of the combined width of the gate driver chips).

According to one embodiment of a module, the module includes a plurality of gate driver chips, a plurality of capacitors and a transverse electromagnetic (TEM) transmission line medium. The plurality of gate driver chips are coupled in parallel and have a common gate input, a common supply voltage and a common output. The plurality of chips are spaced apart from one another and have a combined width extending between an edge of a first outer one of the chips and an opposing edge of a second outer one of the chips. The plurality of capacitors are coupled in parallel between ground and the common supply voltage. The TEM transmission line medium is coupled to the common output of the plurality of chips and has a current flow direction perpendicular to the combined width of the plurality of chips.

According to another embodiment of a module, the module includes a plurality of power transistor chips, a plurality of capacitors and a TEM transmission line medium. The plurality of power transistor chips are coupled in parallel and have a common gate input, a common supply voltage and a common output. The plurality of chips are spaced apart from one another and have a combined width extending between an edge of a first outer one of the chips and an opposing edge of a second outer one of the chips. The plurality of capacitors are coupled in parallel between ground and the common supply voltage. The TEM transmission line medium is coupled to the common gate input of the plurality of chips and has a current flow direction perpendicular to the combined width of the plurality of chips.

According to an embodiment of a power transistor system, the system includes a plurality of gate driver chips, a first plurality of capacitors, a plurality of power transistor chips, a second plurality of capacitors and at least one TEM transmission line medium. The plurality of gate driver chips are coupled in parallel and have a common gate input, a common supply voltage and a common output. The first plurality of capacitors are coupled in parallel between ground and the common supply voltage of the plurality of gate driver chips. The plurality of power transistor chips are coupled in parallel and have a common gate input, a common supply voltage and a common output. The plurality of power transistor chips are spaced apart from one another and have a combined width extending between an edge of a first outer one of the power transistor chips and an opposing edge of a second outer one of the power transistor chips. The second plurality of capacitors are coupled in parallel between ground and the common supply voltage of the plurality of power transistor chips. The at least one TEM transmission line medium couples the common gate input of the plurality of power transistor chips to the common output of the plurality of gate driver chips, and has a current flow direction perpendicular to the combined width of the plurality of power transistor chips.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B illustrate block diagrams of an embodiment of a power transistor system.

FIGS. 14-16 illustrate perspective views of TEM transmission line medium which approximate strip line behaviour in power transistor applications according to various embodiments.

DETAILED DESCRIPTION

Figure 2:
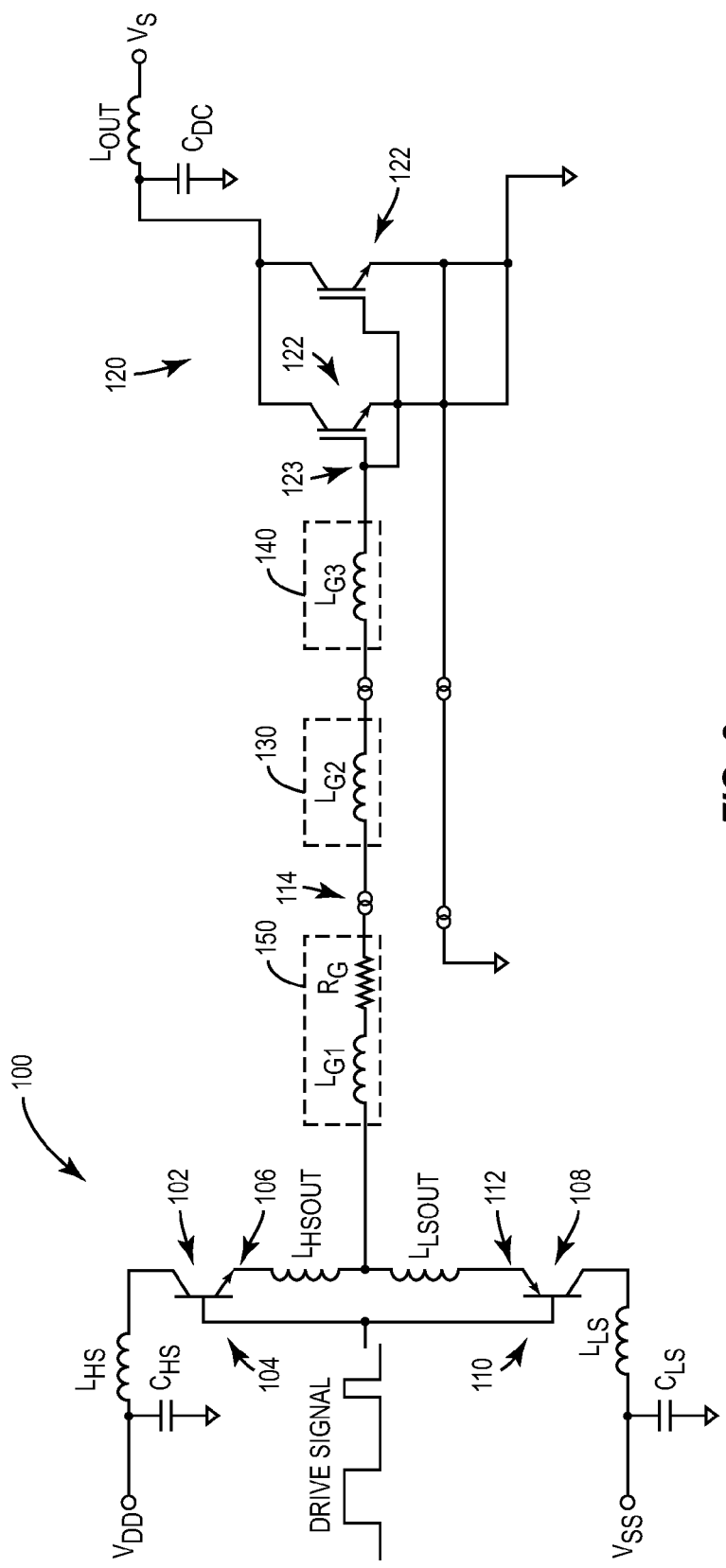
FIG. 2 illustrates a schematic representation of the power transistor system of FIG. 1.
Figure 3A:
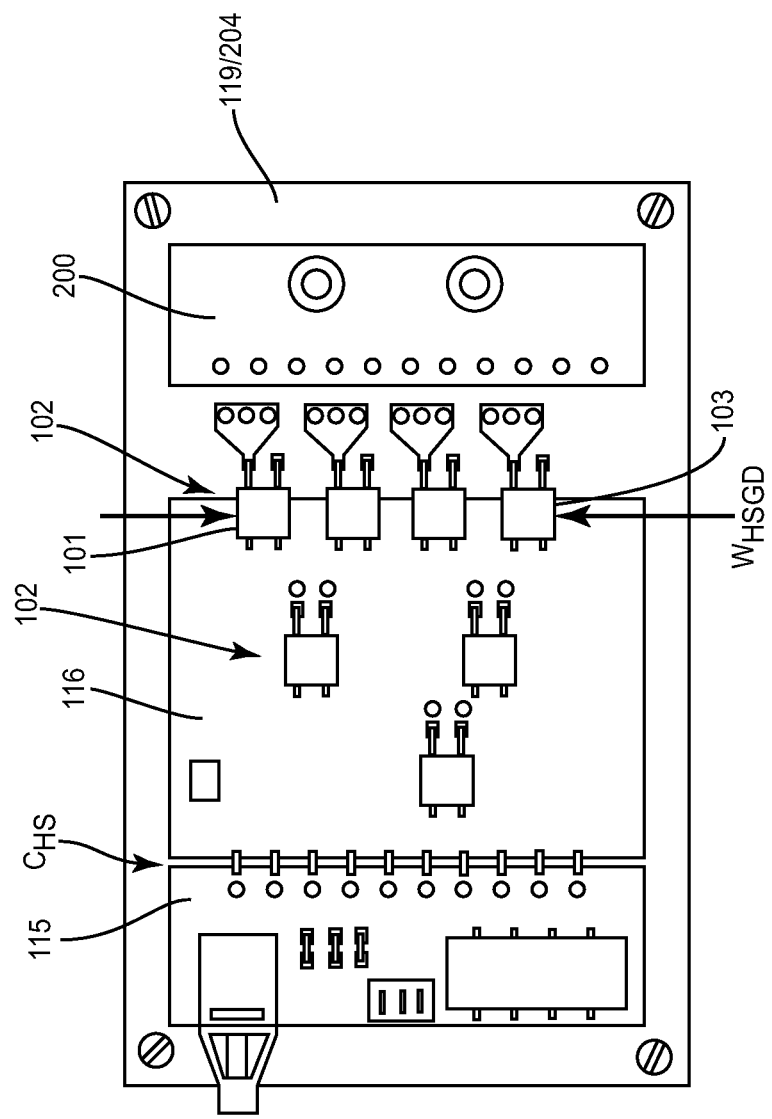
FIGS. 3A and 3B illustrate plan views of an embodiment of the power transistor system of FIG. 1.
Figure 3B:
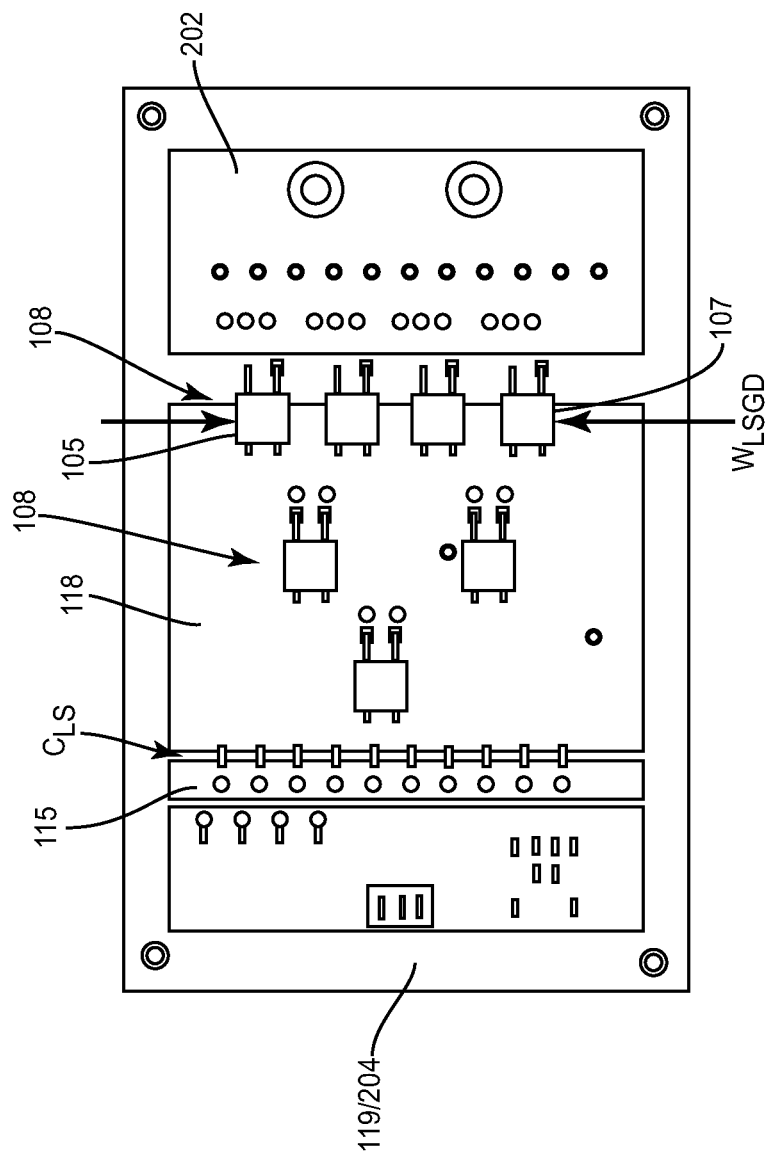

FIGS. 1A and 1B illustrate an embodiment of a power transistor system. FIG. 1A shows a hybrid block diagram/circuit schematic of the high-side components and connections, and FIG. 1B shows a hybrid block diagram/circuit schematic of the corresponding low-side components and connections. FIG. 2 shows an equivalent circuit diagram of the power system of FIG. 1, implemented as an exemplary half-bridge design. In general, the power transistor system may include any type of half-bridge, H-bridge, full-bridge or any other type of power transistor circuit and corresponding gate driver. FIG. 3A shows a plan view of a top side of the gate driver module 100, and FIG. 3B shows a plan view of the opposing bottom side of the gate driver module 100.

The gate driver module 100 includes a plurality of high-side gate driver chips 102 coupled in parallel and having a common gate input 104, a common supply voltage ($V_{DD}$) and a common output 106. The high-side gate driver chips 102 are schematically shown as a plurality of npn transistors in FIG. 1A and a single npn transistor in FIG. 2. The gate driver module 100 also includes a plurality of low-side gate driver chips 108 coupled in parallel and having a common gate input 110, a common supply voltage ($V_{SS}$) and a common output 112. The low-side gate driver chips 108 are schematically shown as a plurality of pnp transistors in FIG. 1A and a single pnp transistor in FIG. 2. Any type of transistor may be for the output stage of the gate driver module 100. For example, push/pull bipolar transistors, MOSFETs, JFETs, unipolar or bipolar gate drivers (i.e. single (+) supply voltage or +/− supply voltage) may be used.

The high-side supply voltage $V_{DD}$ is a positive voltage (e.g. +15V) and the low-side supply voltage $V_{SS}$ is at ground or a negative voltage (e.g. −15V). For power semiconductor devices, ground means a reference point for the device gate signal. The same control signal input ('drive signal') can be applied to the high-side and low-side common gate inputs 104, 110, and the high-side and low-side common outputs 106, 112 are coupled together and provide an output 114 of the gate driver module 100. The connection between the high-side supply voltage $V_{DD}$ and the collectors of the high-side gate driver chips 102 has a corresponding inductance ($L_{HS}$), and the connection between the low-side supply voltage $V_{SS}$ and the collectors of the low-side gate driver chips 108 likewise has a corresponding inductance ($L_{LS}$).

A first set of capacitors ($C_{HS}$) are coupled in parallel between ground and the high-side supply voltage $V_{DD}$. A second set of capacitors ($C_{LS}$) are coupled in parallel between ground and the low-side supply voltage $V_{SS}$. The capacitors may be an integral part of the driver board, with the insulation material serving at least locally as highly dielectric material to store charge. Alternatively, the capacitors may also be discrete components e.g. as shown in FIGS. 3A and 3B. In either case, the connection between the emitters of the high-side gate driver chips 102 and the high-side common output 106 has a corresponding inductance ($L_{HS\_OUT}$), and the connection between the emitters of the low-side gate driver chips 108 and the low-side common output 112 likewise has a corresponding inductance ($L_{O2}$). The gate driver module 100 is coupled to the power transistor module 120 of the power transistor system via one or more transverse electromagnetic (TEM) transmission line media 130, 140. As used herein, the term 'transverse electromagnetic' or 'TEM' for short refers to a mode of propagation where the electric and magnetic field lines are restricted to directions normal (transverse) to the direction of current flow.

As shown in FIG. 3A, the high-side gate driver chips 102 are spaced apart from one another e.g. on a conductive plane 116 connected to the high-side supply voltage $V_{DD}$, and have a combined width ($W_{HS\_GD}$) extending between opposing edges 101, 103 of the outermost high-side gate driver chips 102. FIG. 3B shows the low-side gate driver chips 108 spaced apart from one another e.g. on another conductive plane 118 connected to the low-side supply voltage $V_{SS}$, and having a combined width ($W_{LS\_GD}$) extending between opposing edges 105, 107 of the outermost low-side gate driver chips 108. The high-side and low-side conductive planes 116, 118 may be located at opposite sides of a printed circuit board (PCB) 119 as shown in FIGS. 3A and 3B. Also disposed on each side of the PCB 119 is a ground plane 115 coupled to one terminal of the respective high-side and low-side capacitors ($C_{HS}$, $C_{LS}$). The other terminal of the respective capacitors is coupled to the corresponding conductive planes 116, 118. The gate drivers may have Darlington output stages as shown in FIGS. 3A and 3B where at least the last output stage has a low inductance design.

At least one TEM transmission line media couples the output 114 of the gate driver module 100 to the input of the power transistor module 120. For example in FIGS. 1A and 1B, the gate driver module 100 includes a TEM transmission line medium 150 coupled to the emitters of the high-side and low-side gate driver chips 102, 108. According to one embodiment, this TEM transmission line medium 150 is a strip line with one conductive layer coupled to the emitters of the high-side and low-side gate driver chips 102, 108 and a second conductive layer insulated from the first conductive layer and coupled to ground. The transistors 102, 108 of the gate driver module are in parallel as explained above, thus spreading the gate driver current over the width of the TEM transmission line medium 150 inside the gate driver module 100. The capacitors ($C_{HS}$ and $C_{LS}$) are also built up several capacitors in parallel to spread the capacitor current over the width of the strip line. Also, the rows of capacitors and transistors are integrated behind each other into the strip line to fulfill the rule of current to flow perpendicular to the row of paralleled capacitors or transistors 102, 108. Only the first conductive layer (coupled to the emitters) of the TEM transmission line medium 150 is shown in FIGS. 1A and 1B. The other conductive layer (coupled to ground) is out of view. Current flows back and forth in the TEM transmission line medium 150 during operation, resulting in counteracting magnetic fields which reduce the part of the gate circuit inductance associated with the gate driver module 100, as seen from the power transistor module 120 looking into the gate driver module 100. The gate circuit inductance $L_G$ is limited to $L_G *Achip \leqq 30\,nH*1\,cm^2$ where Achip is the power chip area inside the power module 120, which determines more or less the parasitic capacitance of the chip 122 and the related gate current. Thus the gate circuit inductance scales with chip area.

A second TEM transmission line medium 130 may be coupled to the first TEM transmission line medium 150 of the gate driver module 100. The second TEM transmission line medium 130 may have the same structure as the first TEM transmission line medium 150, e.g. the second TEM transmission line medium 130 may be a strip line with one conductive layer coupled to the conductive layer of the first strip line 150 which is coupled to the gate driver common output 106, 108, and a second conductive layer insulated from the first conductive layer and coupled to ground. As part of the power transistor module 120 or external to the power transistor module 120, another TEM transmission line medium 140 may be provided for coupling the second TEM transmission line medium 130 to the input of the power transistor module 120.

The power transistor module 120 includes a plurality of power transistor chips 122 coupled in parallel and having a common gate input 123, a common supply voltage ($V_S$) and a common output 124. The power transistor chips 122 are schematically shown as a plurality of IGBTs in FIGS. 1 and 2. Any type of power transistor may be used in the power transistor module 120. For example, IGBTs, MOSFETs, JFETs or any other voltage driven device (normally-on or normally-off) may be used. The connection between the supply voltage $V_S$ and the collectors of the power transistor chips 122 has a corresponding inductance ($L_{OUT}$). A plurality of DC blocking capacitors ($C_{DC}$) 126 are coupled in parallel between ground and the supply voltage $V_S$. At the input 123, the gates of the power transistor chips 122 are connected to a TEM transmission line medium 140. This TEM transmission line medium 140 may be external to the power transistor module 120 or integrated within the power module 120.

In either case, the power transistor chips 122 are spaced apart from one another e.g. on a conductive plane connected to the emitters of the power transistor chips 122 and have a combined width (schematically illustrated as $W_{PT}$ in FIGS. 1A and 1B) extending between opposing edges of the outermost power transistor chips 122. The power transistor chips 122 are only schematically shown (as IGBTs) in FIGS. 1A and 1B, but can be physically arranged in a row e.g. as shown in FIGS. 3A and 3B with regard to the gate driver chips 102, 108. As such, the combined width of the power transistor chips 122 corresponds to the individual widths of the chips 122 plus the spacing between adjacent chips (minus any overlap e.g. if the chips are arranged offset form one another).

The TEM transmission line medium 140 having one end connected to the gate inputs 123 of the power transistor chips 122 has an opposite end coupled to the output 114 of the gate driver module 100 e.g. via one or more additional TEM transmission line media 130 as described above. For strip lines, one conductive plane of each strip line couples the output 114 of the gate driver module 100 to the gate input 123 of the power transistor module 120 and the other conductive plane is coupled to ground so that the resulting magnetic fields counteract each other, reducing the gate circuit inductance seen at the gate input 123 of the power transistor module 120. In FIG. 2, the gate circuit inductance corresponds to the inductance ($L_{G1}$) seen looking into the output 114 of the gate drive module 100, the inductance ($L_{G2}$) of the TEM transmission line medium 130 or other connector connected to the gate driver module output 114 and the inductance ($L_{G3}$) of the TEM transmission line medium 140 connected to the gate input 123 of the power transistor module 120. This third inductance $L_{G3}$ may be external or internal to the power transistor module 120 depending on how the gate input connections are provided as explained above. By using one or more TEM transmission line media 130, 140, 150, the gate circuit inductance ($L_{G1}+L_{G2}+L_{G3}$) is significantly reduced as compared to conventional power transistor input interconnections. The output 124 of the power transistor module 120 may also be coupled to a TEM transmission line medium 160 to reduce the output inductance of the power transistor module 120.

Figure 4:
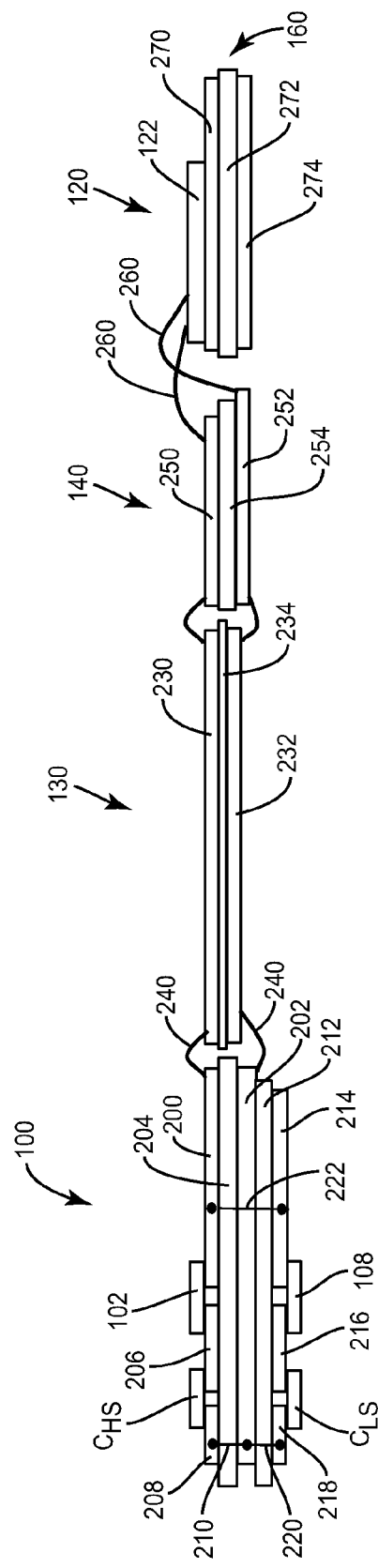
FIG. 4 illustrate a side perspective view of the power transistor system of FIG. 1.

FIG. 4 illustrates a schematic cross-sectional view of an embodiment of the power transistor system of FIG. 1. The plurality of high-side and low-side power supply capacitors ($C_{HS}$, $C_{LS}$) are disposed at opposing sides of the gate driver module 100 and the plurality of high-side and low-side gate driver transistors 102, 108 are also disposed at opposing sides of the gate driver module 100. The TEM transmission line medium 150 included in the gate driver module 100 has a first metallization 200 spaced apart from a second metallization 202 by an insulator 204 such as a PCB or ceramic substrate. The first metallization 200 is connected to the common output 106 of the high-side gate driver transistors 102 and the second metallization 202 is connected to ground. Third and fourth metallizations 206, 208 disposed on the same side of the insulator 204 as the first metallization 200 form the high-side capacitor connections shown in FIG. 2. The ground connection to the high-side capacitors $C_{HS}$ is provided by conductive through holes 210 which extend from the ground plane metallization 202, through the insulator 204 to the corresponding metallization 208. A second insulator 212 is disposed below the second metallization 202, and three additional metallizations 214, 216, 218 are disposed on the opposite side of the second insulator 212 to provide the electrical connections to the low-side capacitors $C_{LS}$ and low-side gate driver transistors 208 shown in FIG. 2. For example, the ground connection to the low-side capacitors $C_{LS}$ is provided by conductive through holes 220 which extend from the ground plane metallization 202, through the second (lower) insulator 212 to the corresponding metallization 214. Conductive through holes 222 are also provided to connect the outputs of the low-side gate driver transistors 208 to the upper metallization 200 of the gate driver module TEM transmission line medium 150. This way, the upper conductive layer 200 of this TEM transmission line medium 150 is coupled to the common outputs 106, 112 of the high-side and low-side gate driver transistors 102, 108 and the lower conductive layer of the TEM transmission line medium 150 is coupled to ground.

The TEM transmission line medium 130 externally connecting the gate driver module 100 to the power transistor module 120 has a similar structure. That is, an upper metallization layer 230 carries the gate driver output signal and a lower metallization 232 is coupled to ground. An insulator 234 is interposed between the two conductive layers 230, 232. Bond wires or other connectors 240 can be used to make the appropriate electrical connections to the gate driver module 100. The TEM transmission line medium 140 at the gate input side of the power transistor module 120 also has an upper metallization layer 250 which carries the gate driver output signal and a lower metallization layer 252 coupled to ground, with an insulator 254 interposed between the two conductive layers 250, 252. Bond wires or other connectors 260 can be used to make the appropriate electrical connections to the input side of the power transistor module 120. For example, the conductive layer 250 which carries the gate driver output signal is coupled to the gates of the power transistors 122 and the grounded conductive layer 252 is connected to an auxiliary emitter of the power transistors 122. The auxiliary emitter connection is unpowered and coupled to the emitter of the power transistors 122. A separate terminal is provided for the main (powered) emitter connection. The power transistor chips 122 are attached to a lower metallization layer 270 within the power module 120. This lower metallization layer 270 provides an output connection for the power transistor module 120. The output connection can also be a TEM transmission line medium 160 by providing an insulator layer 272 between the output metallization 270 and an additional metallization layer 274 which is grounded.

Figure 5:
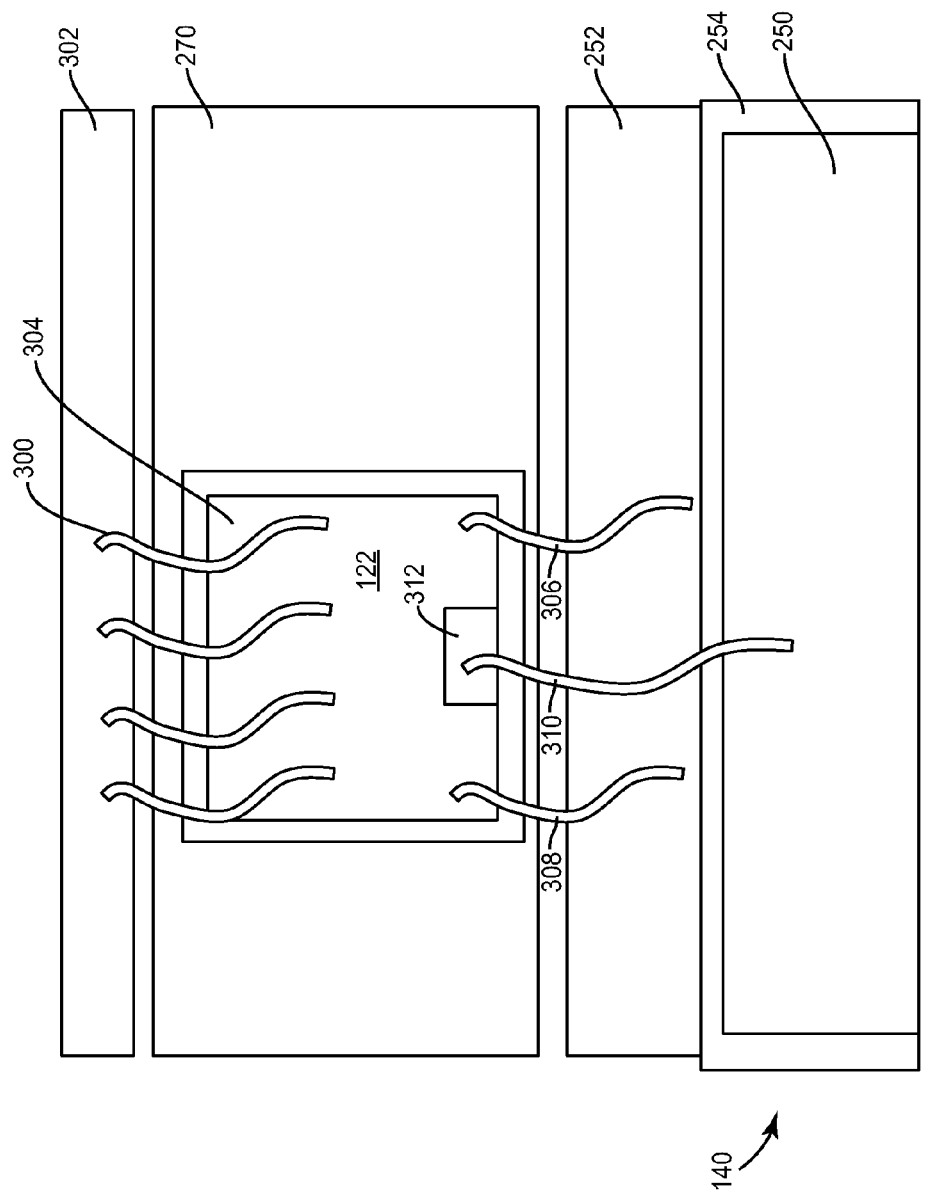
FIGS. 5-9 illustrate plan views of transverse electromagnetic (TEM) transmission line medium connections to a power transistor chip according to various embodiments.
Figure 6:
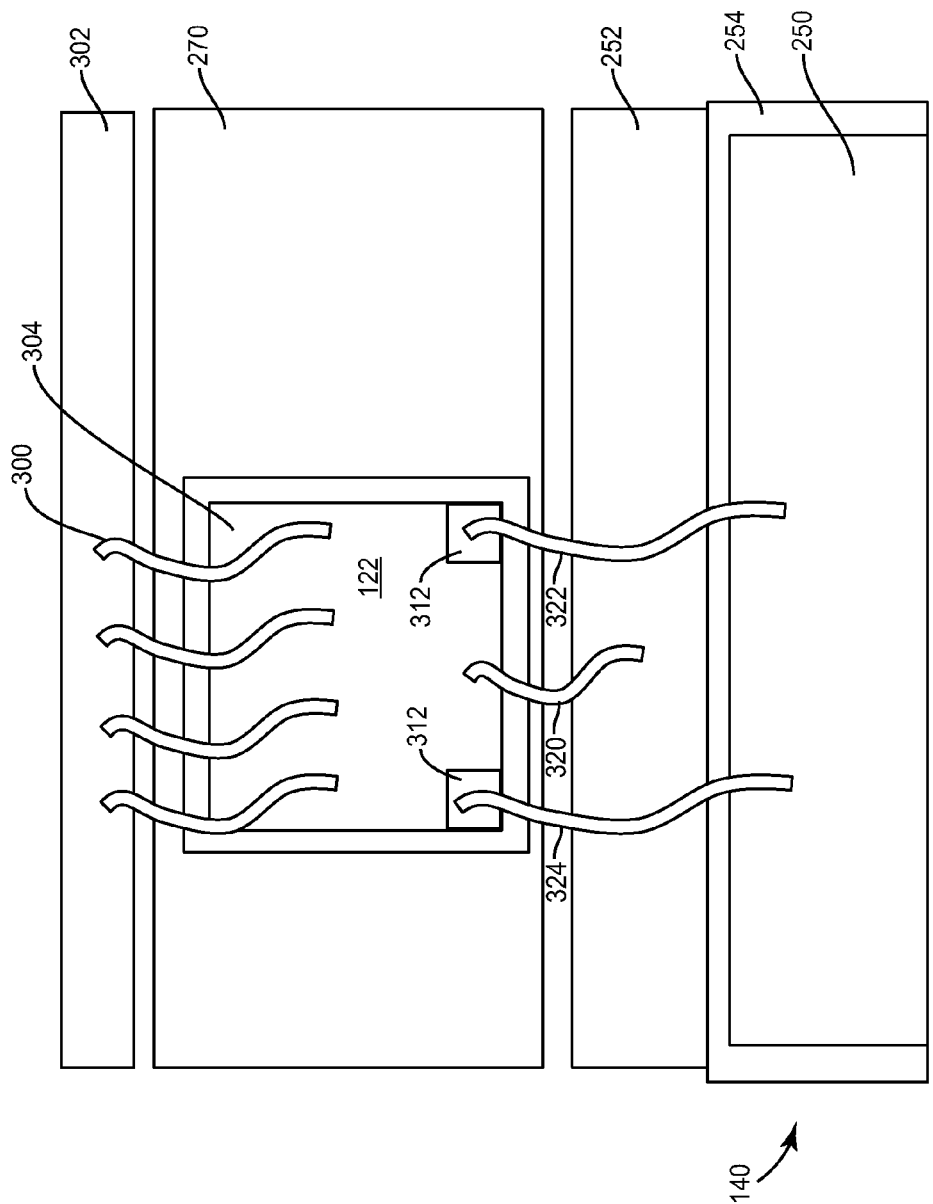
Figure 7:
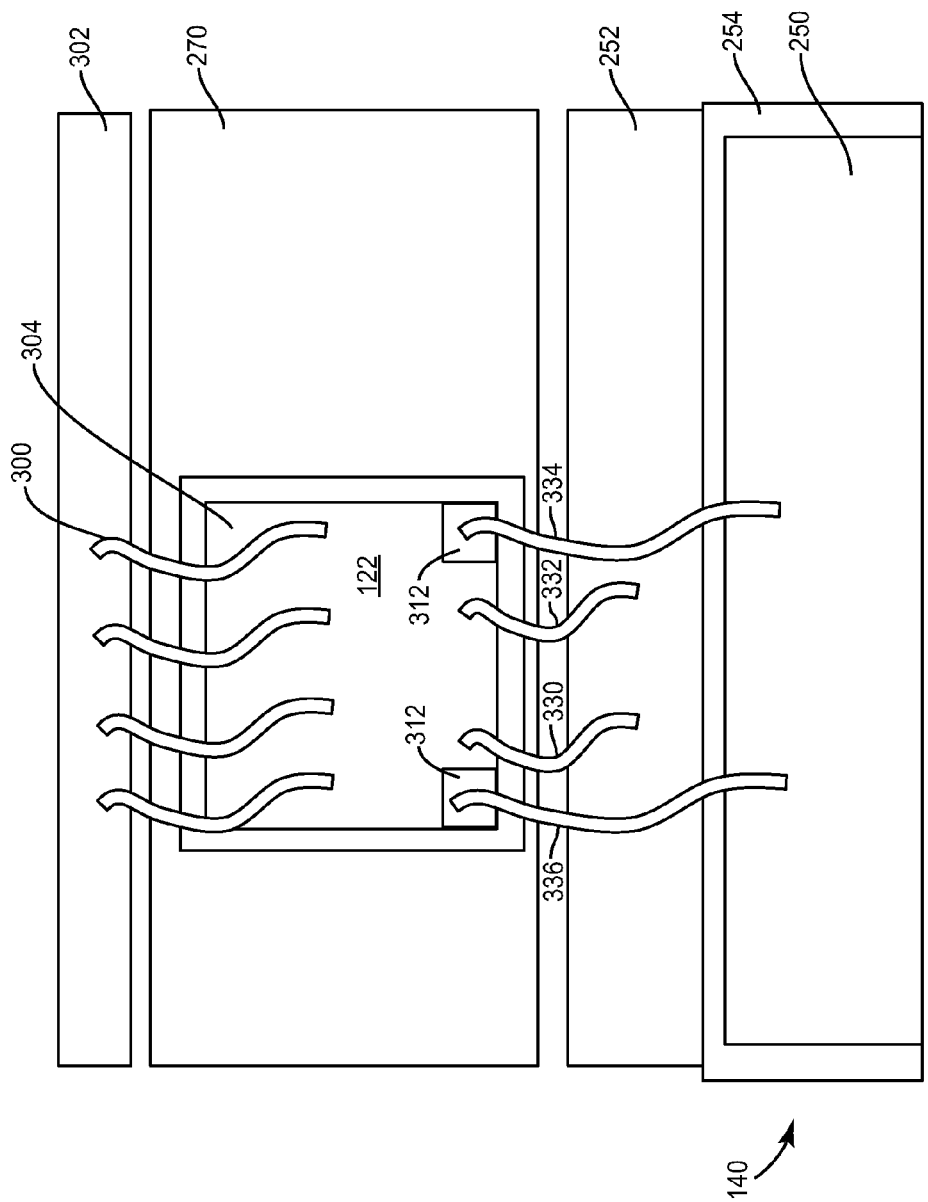

FIGS. 5-7 illustrate various top plan down views of embodiments of the connections to an individual one of the power transistor chips 122. In FIG. 5, a number of wire bond connections 300 are provided from the main (powered) emitter terminal 302 to the emitter 304 of the power transistor chip 122. Two wire bond connections 306, 308 are provided from the grounded metallization layer 252 of the input TEM transmission line medium 140 to the auxiliary (unpowered) emitter 304 of the power transistor chip 122. A single wire bond connection 310 is provided from the metallization layer 250 of the input TEM transmission line medium 140 carrying the gate driver output signal to a single gate pad 312 of the power transistor chip 122. An insulator 254 is interposed between the two metallization layers 250, 252 of the TEM transmission line medium 140 as previously described herein. FIG. 6 is similar to FIG. 5, however a single auxiliary emitter connection 320 and two gate connections 322, 324 are provided. FIG. 7 is similar to FIGS. 5 and 6, but two auxiliary emitter connections 330, 332 and two gate connections 334, 336 are provided. In each case, the lengths of the wires used to connect to the gate and auxiliary emitter of the power transistor chips 122 is preferably limited to 10 cm maximum per chip and the distance is preferably limited to 3 mm maximum per chip at a typical wire diameter of 0.4 to 0.6 mm, which relates to gate circuit inductance $L_G$ of 13 nH to 11 nH, respectively.

Figure 8:
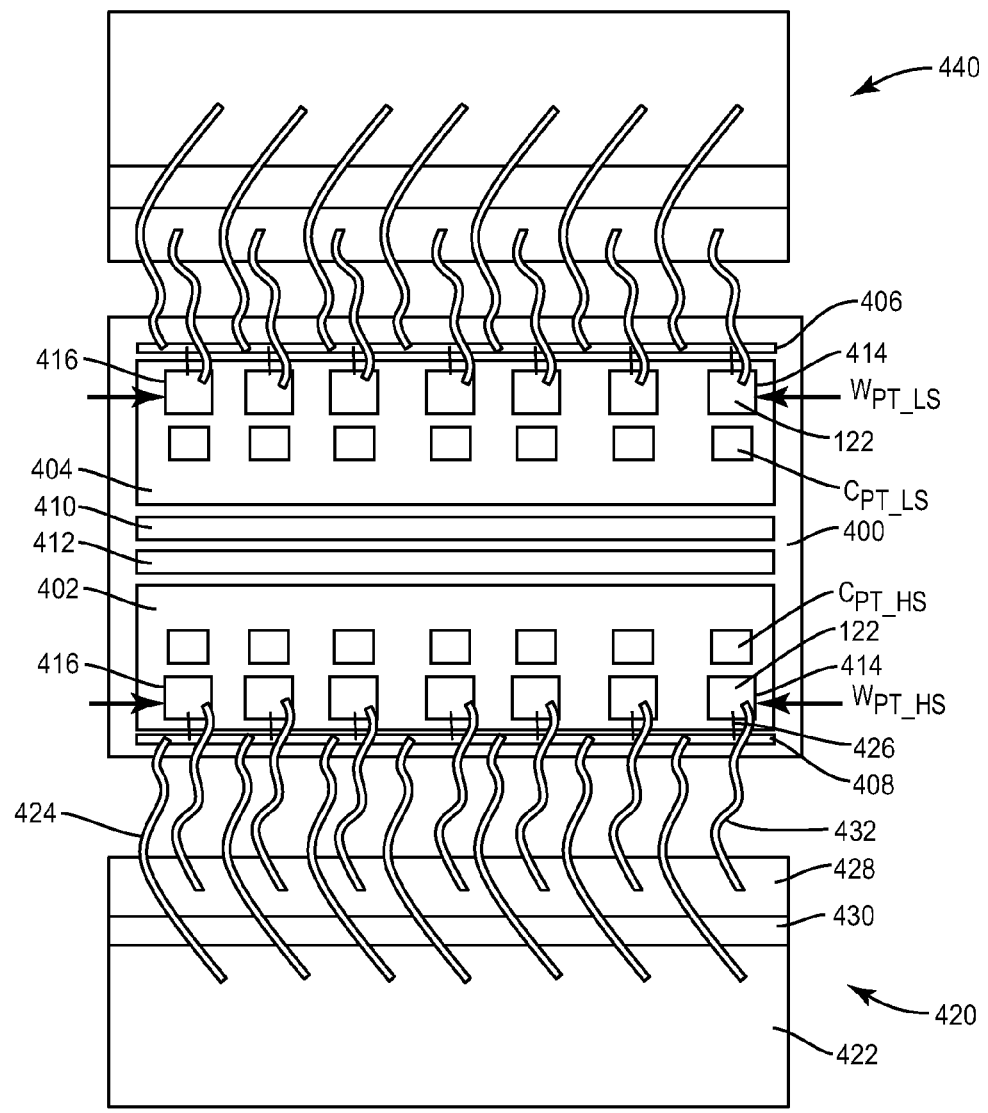

FIG. 8 illustrates a top down plan view of the power transistor module 120 with the housing or cover removed. Only the electrical connections between the input TEM transmission line media 140 and the power transistor chips 122 are shown for ease of illustration only. Those skilled in the art will readily recognize how the remaining connections are made. The power transistor chips 122 are disposed on a substrate 400 such as a PCB or ceramic substrate. The high-side capacitors ($C_{PT\_HS}$) and power transistors 122 are positioned on one output terminal 402 and the low-side capacitors ($C_{PT\_LS}$) and power transistors 122 are positioned on another output terminal 404. Respective gate input terminals 406, 408 and respective power supply terminals 410, 412 are also provided. All of the terminals 402, 404, 406, 408, 410, 412 are disposed on the substrate 400.

The power transistor chips 122 on each output terminal 402, 404 are spaced apart from one another and have a combined width ($W_{PT}$) extending between opposing edges 414, 416 of the outermost power transistor chips 122. A first input TEM transmission line medium 420 comes in from one side of the module 120 and has a first metallization layer 422 which carries the gate driver output signal and connects to the high-side gate terminal 408 of the module 120. Several connections 424 are made from the first metallization layer 422 to the high-side gate terminal 408, and several additional connections 426 are made from the high-side gate terminal 408 to the gate inputs of the high-side power transistor chips 122 as previously described herein. The first input TEM transmission line medium 420 also has a second (grounded) metallization layer 428 separated from the first metallization layer 422 by an insulator 130 and is connected to the auxiliary (unpowered) emitter of the high-side power transistor chips 122 also as previously described herein e.g. via wire bond connections or other types of connections 432. A second input TEM transmission line medium 440 comes in from another side of the module 120 and similarly connects to the gate and auxiliary emitter inputs of the low-side power transistor chips 122.

Figure 9:
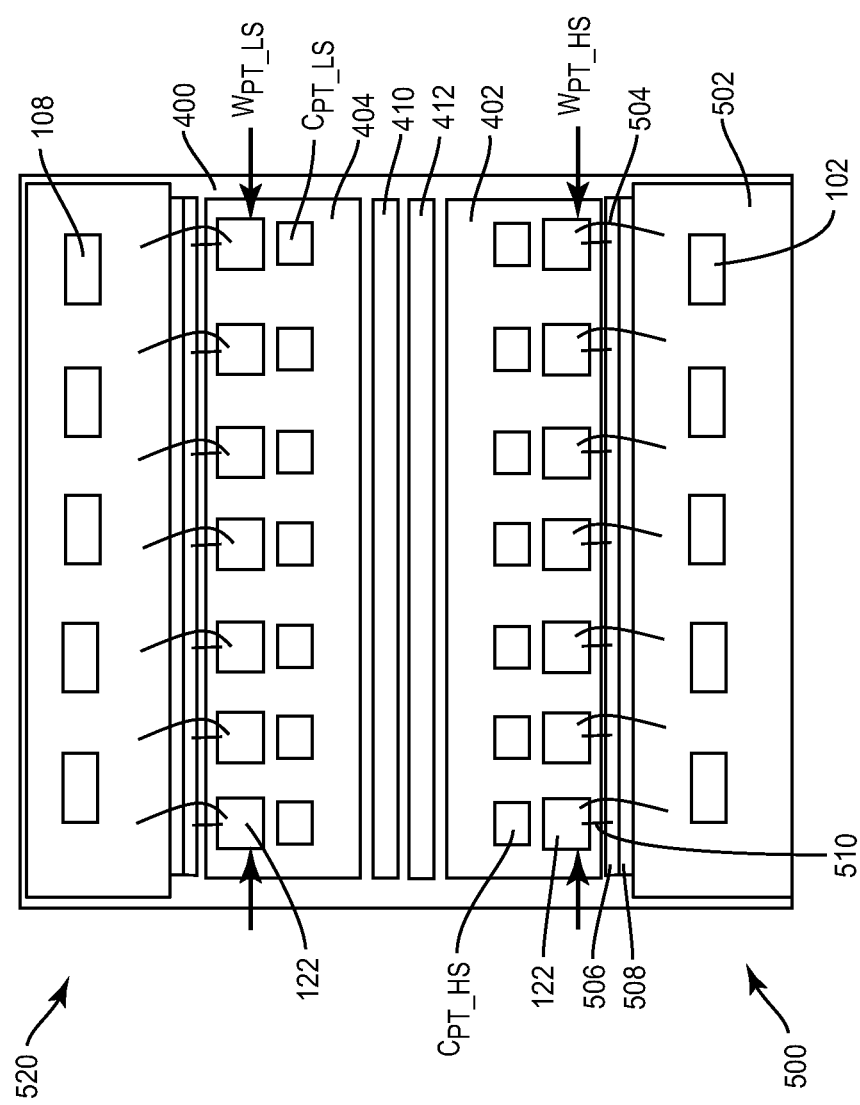

FIG. 9 illustrates another embodiment of the power transistor module 120 with the housing or cover removed. This embodiment is similar to the one shown in FIG. 8, however the gate driver circuitry is integrated within the power transistor module 120. According to this embodiment, the high-side gate driver chips 102 are disposed on a top metallization layer 502 of a TEM transmission line medium 500. This metallization layer 502 carries the gate driver output signal of the high-side gate driver transistors 102 and is directly connected to the gate inputs of the high-side power transistor chips 122 via several connections 504. A corresponding (grounded) lower metallization layer 506 of the first TEM transmission line medium 500 is separated from the upper metallization layer 502 by an insulator 508 and is connected to the auxiliary (unpowered) emitters of the high-side power transistors 122 via several connections 510. The low-side gate driver chips 108 are disposed on a second TEM transmission line medium 520 which is similarly connected to the gate and auxiliary emitter inputs of the low-side power transistor chips 122. Additional connections between the gate driver output and the power transistor input are eliminated according to this integrated embodiment.

Figure 10:
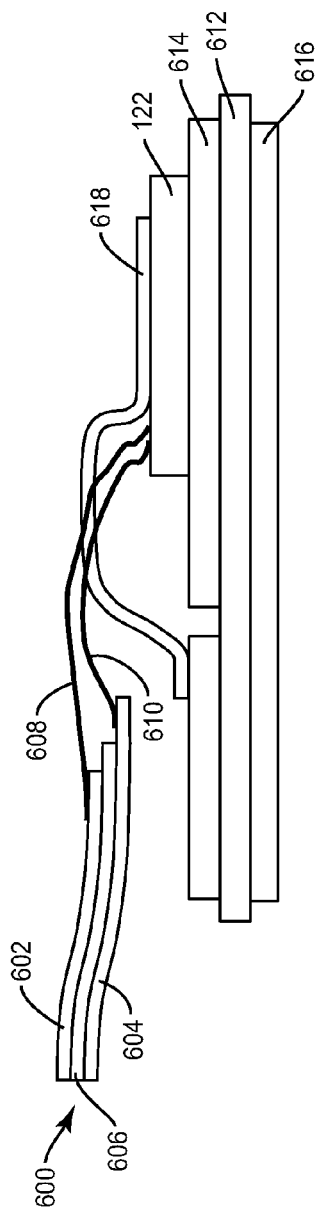
FIGS. 10-12 illustrate side perspective views of TEM transmission line medium connections to a power transistor chip according to various embodiments.
Figure 11:
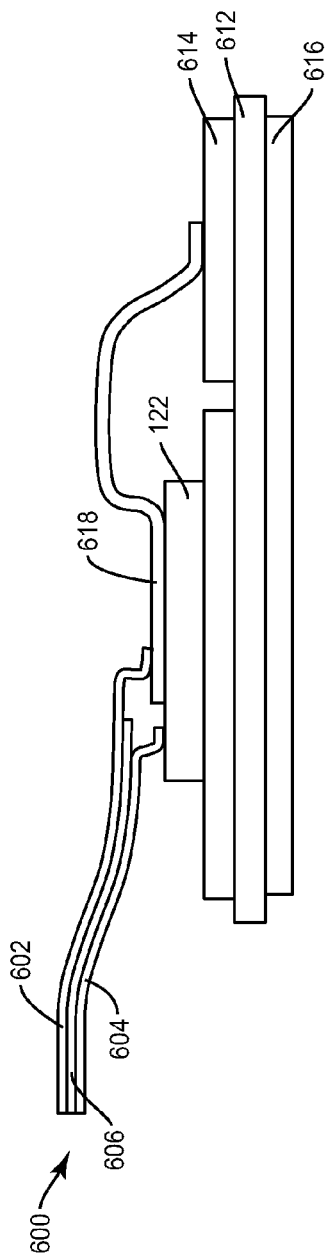
Figure 12:
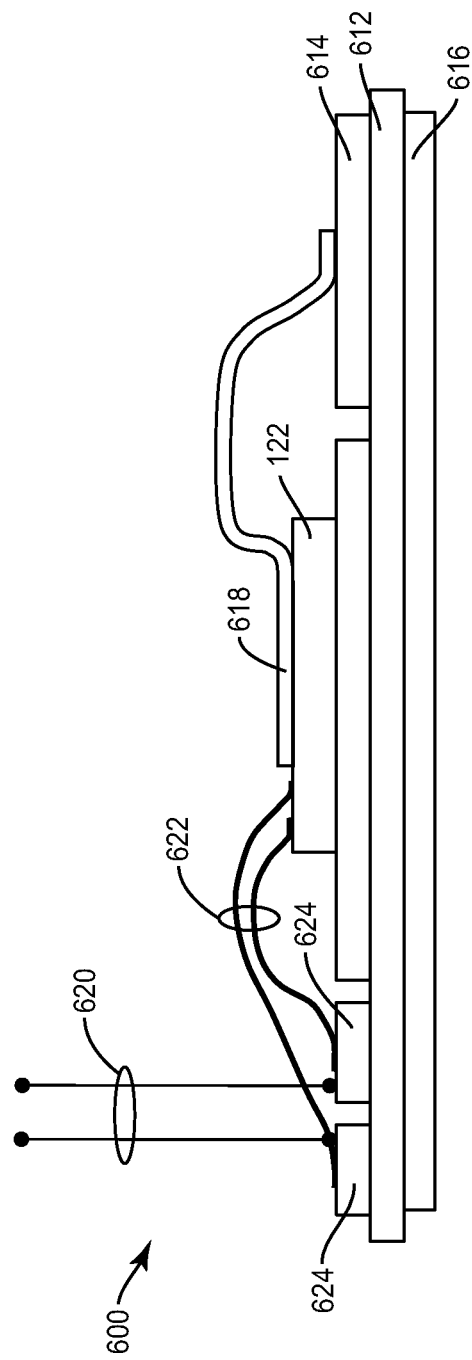

FIGS. 10-12 illustrate various connection embodiments between a TEM transmission line medium 600 and a power transistor chip 122. According to these embodiments, the TEM transmission line medium 600 is a strip line having a first (upper) conductive layer 602 separated from a second (lower) conductive layer 604 by an insulator 606. The upper conductive layer 602 carries the output signal from a gate driver circuit and the lower conductive layer 604 is coupled to ground. In FIG. 10, the strip line 600 comes down from outside the power transistor module or from the terminals of the module and extends all the way through to the chip level where the strip line 600 is connected by wire bonds 608, 610 directly to the power transistor chip 122. The wire bonding can be supported from the bottom at the bond points. In order hold the strip line in place during the bonding process, the strip line 600 can be glued down to the substrate 612 (which may have an upper patterned metallization layer 614 and a lower metallization layer 616) or the wires may already be bonded outside at a first end (out of view) of the strip line 600 and the second end of the strip line 600 is then bonded to the chip 122 in a second step. In each case, the upper conductive layer 602 is connected to the gate input of the power transistor chip 122 and the lower conductive layer 604 is connected to the auxiliary (unpowered) emitter of the chip 122.

In FIG. 11, the strip line 600 comes down from outside the module or from the module terminals and extends all the way to the chip level where the strip line 600 is directly joined, e.g. ultrasonically welded, laser welded, glued, soldered, diffusion soldered or sintered to the power transistor chip 122. Each power transistor chip 122 can have a thick metallization 618 more or equal to 10 μm, mainly made from copper.

In FIG. 12, the strip line 600 is approximated by several pins 620 in parallel as terminals (paralleled pins not shown) continued by wires or ribbons 622 bonded from pin landing points 624 to the power transistor chip 122 as previously described herein. The pins 620 can be ultrasonically welded, laser welded, glued, soldered, diffusion soldered or sintered. A pin-rivet assembly can also be used for the pins 620.

Figure 13A:
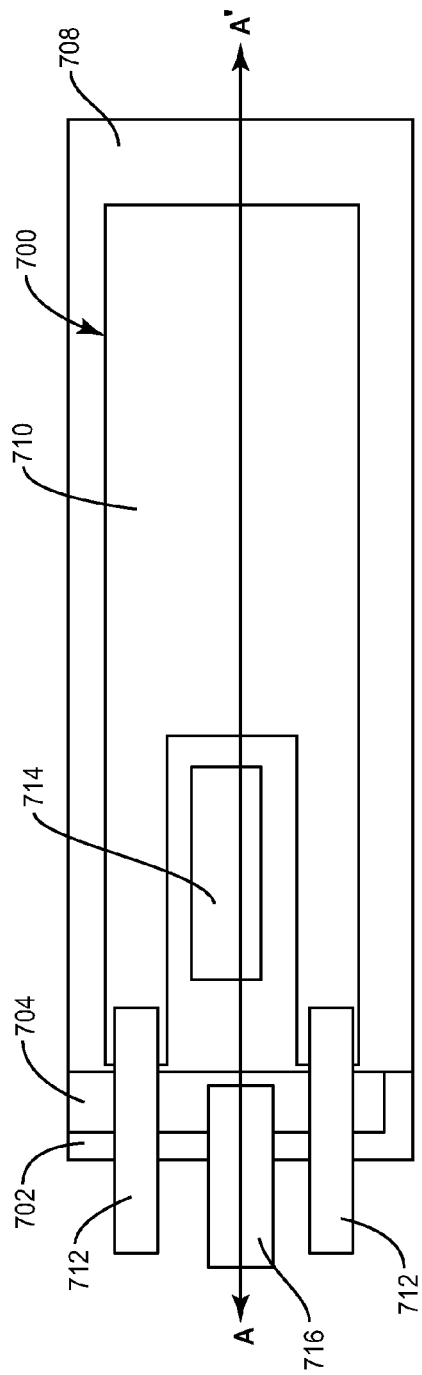
FIG. 13A illustrates a plan view of a power transistor module with an integrated TEM transmission line medium.
Figure 13B:
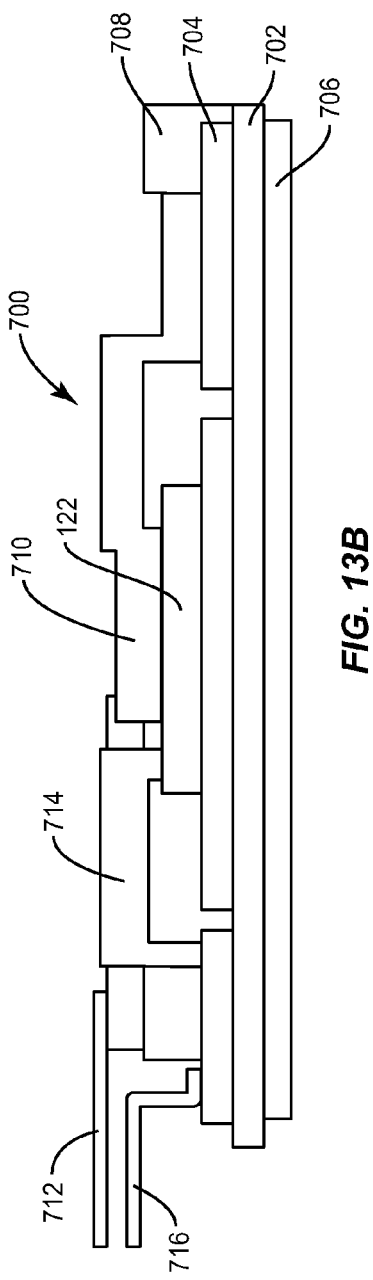
FIG. 13B illustrates a cross-sectional perspective view of the power transistor module of FIG. 13A along the line labelled A-A'.

FIG. 13A illustrates a top plan view of an embodiment of the power transistor module 120. FIG. 13B is a cross-sectional view of the module of FIG. 13A along the line labeled A-A'. According to this embodiment, the power transistor module 120 has a multilayer structure 700 over a substrate 702 on which the power transistor chips 122 are disposed. By embedding, laminating, metallization and/or other structuring processes, a strip line is integrated in the multilayer structure 700 and extends through to external drivers or strip lines and are joined to the multilayer structure 700 including the substrate 702. For example, the substrate 702 is an insulator such as a ceramic substrate with a patterned top metallization layer 704 and a bottom metallization layer 706. The power transistor chips 122 are attached to one region of the top patterned metallization layer 704, and an insulator 708 is disposed over the substrate 702 and chips 122. One part of the multilayer structure 700 includes a metallization 710 which is connected to the gate inputs of the power transistor chips 122. This part 710 of the multilayer structure 700 is connected to a line 712 which carries the gate driver output signal. A second part 714 of the multilayer structure 700 is separated from the first part 710 and connected to the auxiliary (unpowered) emitter of the power transistor chips 122. This second part 714 of the multilayer structure 700 extends through the module insulator 708 to the top patterned metallization layer 704 on the substrate 702. This part of the top patterned metallization layer 704 is connected to a line 716.

The TEM transmission line media used to couple the common gate input of the power transistor chips 122 to the common output of the gate driver chips 102, 108 need not be only a strip line. The TEM transmission line media may approximate a strip line in order to provide a low gate circuit inductance to the power transistor module 120.

FIG. 14 shows an embodiment of a TEM transmission line medium 800 implemented as a strip line with upper and lower spaced apart conductive layers 802, 804. One conductive layer 802 couples the gate driver output to the power transistor gate input (and is therefore labelled 'G'). This conductive layer 804 carries the gate driver output signal. This conductive layer 802 is grounded and coupled to the auxiliary (unpowered) emitters of the power transistors 122 (and is therefore labelled 'E').

FIG. 15 shows an embodiment of a TEM transmission line medium 810 implemented as a plurality of individual conductor wires arranged in two different spaced apart layers 812, 814 which collectively approximate the behaviour of a strip line. For example, the upper wiring layer 812 couples the gate driver output to the power transistor gate input (and is therefore labelled 'G'). The wires of this layer 812 collectively carry the gate driver output signal. The lower wiring layer 814 is grounded and coupled to the auxiliary (unpowered) emitters of the power transistors 122 (and is therefore labelled 'E'). The current flows in the opposite direction in the two wiring layers 412, 414. To limit the resistive overvoltage during fault conditions the gate resistor ($R_G$) is lowered. As the gate resistor ($R_G$) is often used to set the switching speed of the power switches 122, the gate driver 100, optionally, has a slope control feature to be able to reduce the gate resistor. $R_G$ per power-chip can be 10 Ohm, <5 Ohm, <1 Ohm, <0.4 Ohm, or $R_G*\text{Achip} \leq 10(5, 1)$ Ohm*1 $cm^2$ where Achip is the power chip area inside the power module 120.

FIG. 16 shows an embodiment of a TEM transmission line medium 820 implemented as a plurality of individual conductor wires 822, 824 arranged in the same wiring layer 826. As opposed to the TEM structure shown in FIG. 15, the TEM structure shown in FIG. 16 has only a single layer 826 of wires 822, 824. To approximate the behaviour of a strip line, the wires 822, 824 are dielectrically insulated from one another. Every other wire 824 couples the gate driver output to the power transistor gate input (and are therefore labelled 'G'). These wires 824 carry the gate driver output signal. The remaining wires 822 are grounded and coupled to the auxiliary (unpowered) emitter of the power transistors 122 (and are therefore labelled 'E'). In the embodiments of FIGS. 15 and 16, the inductance of each individual wire is greater than the combined inductance of all the wires in each layer. For larger distance of paralleled chips and common mode problems arising from asymmetric power connections, groups of paralleled chips may have separate low inductance gate circuits up to the driver board where the common mode shifts can be filtered.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module, comprising:
   a plurality of gate driver chips coupled in parallel and having a common gate input, a common supply voltage and a common output, the plurality of chips being spaced apart from one another and having a combined width extending between an edge of a first outer one of the chips and an opposing edge of a second outer one of the chips;
   a plurality of capacitors coupled in parallel between ground and the common supply voltage; and
   a transverse electromagnetic (TEM) transmission line medium coupled to the common output of the plurality of chips and having a current flow direction perpendicular to the combined width of the plurality of chips.

2. A module as claimed in claim 1, wherein the TEM transmission line medium is a strip line comprising a first electrically conductive strip dielectrically insulated from a second electrically conductive strip, the first electrically conductive strip being coupled to the common output of the plurality of chips and the second electrically conductive strip being coupled to ground.

3. A module as claimed in claim 1, wherein the TEM transmission line medium comprises a plurality of wires dielectrically insulated from one another, and wherein the inductance of each individual wire is greater than the combined inductance of all the wires.

4. A module as claimed in claim 1, wherein the TEM transmission line medium comprises a plurality of wires dielectrically insulated from one another, and wherein every other wire is coupled to the common output of the plurality of chips and the remaining wires are coupled to ground.

5. A module as claimed in claim 1, wherein the TEM transmission line medium is coupled to the common output of the plurality of chips via a plurality of bond wires.

6. A module as claimed in claim 1, wherein the TEM transmission line medium is directly connected to the output of each chip.

7. A module as claimed in claim 1, wherein the plurality of chips are arranged on an insulator, and wherein the TEM transmission line medium comprises a first metallization layer disposed on a first side of the insulator and connected to the common output of the plurality of chips and a second metallization layer disposed on an opposing second side of the insulator and connected to ground.

8. A module as claimed in claim 1, further comprising a plurality of power transistor chips integrated in the same module as the plurality of gate driver chips and having a common gate input coupled to the common output of the plurality of gate driver chips via the TEM transmission line medium.

9. A module as claimed in claim 8, wherein the plurality of power transistor chips have a common unpowered emitter input coupled to ground via the TEM transmission line medium.

10. A module, comprising:
    a plurality of power transistor chips coupled in parallel and having a common gate input, a common supply voltage and a common output, the plurality of chips being spaced apart from one another and having a combined width extending between an edge of a first outer one of the chips and an opposing edge of a second outer one of the chips;
    a plurality of capacitors coupled in parallel between ground and the common supply voltage; and
    a transverse electromagnetic (TEM) transmission line medium coupled to the common gate input of the plurality of chips and having a current flow direction perpendicular to the combined width of the plurality of chips.

11. A module as claimed in claim 10, wherein the TEM transmission line medium is a strip line comprising a first electrically conductive strip dielectrically insulated from a second electrically conductive strip, the first electrically conductive strip being coupled to the common gate input of the plurality of chips and the second electrically conductive strip being coupled to ground.

12. A module as claimed in claim 10, wherein the TEM transmission line medium comprises a plurality of wires dielectrically insulated from one another, and wherein the inductance of each individual wire is greater than the combined inductance of all the wires.

13. A module as claimed in claim 10, wherein the TEM transmission line medium comprises a plurality of wires dielectrically insulated from one another, and wherein every other wire is coupled to the common gate input of the plurality of chips and the remaining wires are coupled to ground.

14. A module as claimed in claim 10, wherein the TEM transmission line medium is coupled to the common gate input of the plurality of chips via a plurality of bond wires.

15. A module as claimed in claim 10, wherein the TEM transmission line medium is directly connected to the gate input of each chip.

16. A module as claimed in claim 10, wherein the plurality of chips are arranged on an insulator, and wherein the TEM transmission line medium comprises a first metallization layer disposed on a first side of the insulator and connected to the common gate input of the plurality of chips and a second metallization layer disposed on an opposing second side of the insulator and connected to ground.

17. A module as claimed in claim 10, further comprising a plurality of gate driver chips integrated in the same module as the plurality of power transistor chips, the plurality of gate driver chips having a common output coupled to the common gate input of the plurality of power transistor chips via the TEM transmission line medium.

18. A module as claimed in claim 10, wherein the plurality of chips have a common unpowered emitter input, and wherein the TEM transmission line medium comprises a first conductor coupled to the common gate input of the plurality of power transistor chips and a second conductor coupled to the common unpowered emitter input of the plurality of power transistor chips, the first and second conductors being insulated from one another.

19. A power transistor system, comprising:
- a plurality of gate driver chips coupled in parallel and having a common gate input, a common supply voltage and a common output;
- a first plurality of capacitors coupled in parallel between ground and the common supply voltage of the plurality of gate driver chips;
- a plurality of power transistor chips coupled in parallel and having a common gate input, a common supply voltage and a common output, the plurality of power transistor chips being spaced apart from one another and having a combined width extending between an edge of a first outer one of the power transistor chips and an opposing edge of a second outer one of the power transistor chips;
- a second plurality of capacitors coupled in parallel between ground and the common supply voltage of the plurality of power transistor chips; and
- at least one transverse electromagnetic (TEM) transmission line medium coupling the common gate input of the plurality of power transistor chips to the common output of the plurality of gate driver chips, and having a current flow direction perpendicular to the combined width of the plurality of power transistor chips.

20. A power transistor system according to claim 19, wherein the plurality of gate driver chips are spaced apart from one another and have a combined width extending between an edge of a first outer one of the gate driver chips and an opposing edge of a second outer one of the gate driver chips, and wherein the at least one TEM transmission line medium comprises first and second TEM transmission line media coupling the common gate input of the plurality of power transistor chips to the common output of the plurality of gate driver chips, the first TEM transmission line medium having a current flow direction perpendicular to the combined width of the plurality of power transistor chips, the second TEM transmission line medium having a current flow direction perpendicular to the combined width of the plurality of gate driver chips.

21. A power transistor system according to claim 20, further comprising a third TEM transmission line medium coupling the first TEM transmission line medium to the second TEM transmission line medium.

* * * * *